United States Patent
Hezar et al.

(10) Patent No.: US 7,903,015 B1
(45) Date of Patent: Mar. 8, 2011

(54) CASCADED DAC ARCHITECTURE WITH PULSE WIDTH MODULATION

(75) Inventors: Rahmi Hezar, Plano, TX (US); Lars Risbo, Hvalso (DK)

(73) Assignee: Texas Instruments Incorporated, Dallas, TX (US)

( * ) Notice: Subject to any disclaimer, the term of this patent is extended or adjusted under 35 U.S.C. 154(b) by 22 days.

(21) Appl. No.: 12/546,521

(22) Filed: Aug. 24, 2009

(51) Int. Cl.
*H03M 1/82* (2006.01)
(52) U.S. Cl. .......................................... 341/152; 341/144
(58) Field of Classification Search .................. 341/144, 341/139, 61, 120, 152; 375/242, 243, 238
See application file for complete search history.

(56) References Cited

U.S. PATENT DOCUMENTS

| 6,933,872 B2 * | 8/2005 | Kranz | 341/144 |
| 7,138,395 B2 * | 11/2006 | O'Neil et al. | 514/230.5 |
| 7,308,027 B1 * | 12/2007 | Gaboriau et al. | 375/238 |

* cited by examiner

*Primary Examiner* — Peguy JeanPierre
(74) *Attorney, Agent, or Firm* — Ronald O. Nerrings; Wade James Brady, III; Frederick J. Telecky, Jr.

(57) ABSTRACT

An embodiment of the invention provides one or more cascade circuits that are cascaded together to form a cascaded circuit. The cascaded circuit reduces noise at an analog output of the cascaded circuit. Each of the cascade circuits contains a noise-shaping circuit, a PCM (Pulse Code Modulation)-to-PWM (Pulse Width Modulation) converter and a 1-bit P-tap AFIR (Analog Finite Impulse Response) filter DAC. Noise at the output of the cascaded circuit may be further reduced by increasing the number of cascade circuits.

20 Claims, 9 Drawing Sheets

CASCADED DAC ARCHITECTURE WITH PULSE WIDTH MODULATION

BACKGROUND

Digital-to-Analog converters (DACs) are found in many electronic devices. For example, DACs are used in PDAs (Personal Digital Assistant), cellular phones, computers, video players and CD players. DACs convert a digital signal into an analog signal. Analog signals include music and voice.

In the process of converting a digital signal to an analog signal, noise may be created. Noise may be any electrical contribution added to a signal that was not part of the original source that created the signal. For example, some sources of noise are thermal noise, phase noise, quantization noise and switching noise. During the process of converting a digital signal to an analog signal, the original signal may be distorted. There are many types of distortion such a harmonic distortion, and intermodulation distortion.

At low signal levels, the human ear is very sensitive to low level noise and distortion. Because the human ear is very sensitive to noise and distortion at low signal levels, methods have been devised to attenuate noise and distortion at low signal levels. For example, noise-shaping filters shift quantization noise from in-band (typically from 20 Hz to 20,000 Khz, the frequency range of human hearing) to out-of-band quantization noise (typically from 20 KHz and above). AFIR (Analog Finite Impulse Response) filters are used to reduce out-of-band noise (OBN).

Due to manufacturing variance, current segments in a DAC array will have slightly different values from each other. This variance in the current segments of a DAC array may cause harmonic distortion and may raise the noise level in a DAC. Inter-symbol interference due to uneven rise and fall times and parasitic capacitances may cause distortion and noise as well.

DETAILED DESCRIPTION

The drawings and description, in general, disclose one or more cascade circuits that are cascaded together to form a cascaded circuit. The cascaded circuit reduces out-of-band quantization noise at an analog output of the cascaded circuit. Each of the cascade circuits contain a noise-shaping circuit, a PCM (Pulse Code Modulation)-to-PWM (Pulse Width Modulation) converter and a 1-bit P-tap AFIR (Analog Finite Impulse Response) filter DAC. Out-of-band quantization noise at the output of the cascaded circuit may be further reduced by increasing the number of cascade circuits. In addition, out-of-band quantization noise may be reduced to a level that is at or below the thermal noise level with minimum silicon area.

In this exemplary embodiment, the noise-shaping circuit shifts, for example, quantization noise from within the audible range (often called "in-band", typically 20 Hz to 20 KHz), to a frequency range outside the audible range (often called "out-of-band", typically 20 KHz and higher). In addition, the noise-shaping circuit in this example converts PCM M-bit digital words to PCM N-bit digital words where M and N are integers and M is greater than N. The sampling frequency of the PCM M-bit digital words and the PCM N-bit digital words, in this example, is Fs.

In this exemplary embodiment, the PCM-to-PWM converter converts PCM N-bit digital words sampled at a frequency of Fs to PWM 1-bit words at a frequency of $(2^N)*Fs$. The PWM 1-bit words are then input into the P-tap AFIR filter 1-bit DAC. Pulse width modulation reduces sensitivity to to analog glitch energies and an P-tap AFIR filter in each cascade circuit reduces mismatch errors. Each tap in each AFIR filter is a small 1-bit DAC and an analog output is formed by summing the outputs of all such 1-bit DACs of the AFIRs in all the cascade circuits.

Figure 1:
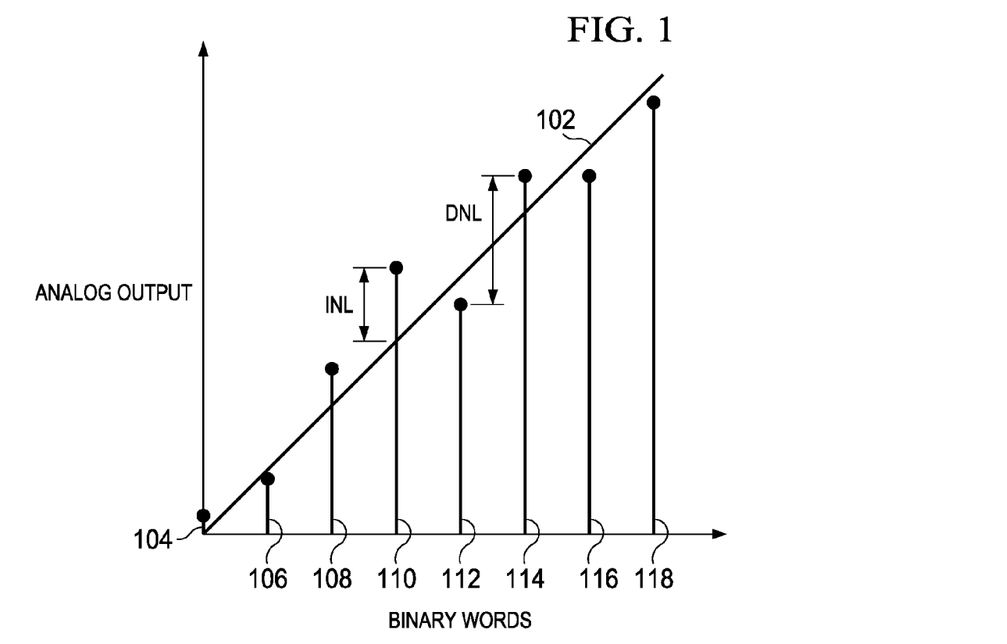
FIG. 1 is a plot of an ideal analog output versus the magnitude of eight 3-bit binary words.
Figure 2A:
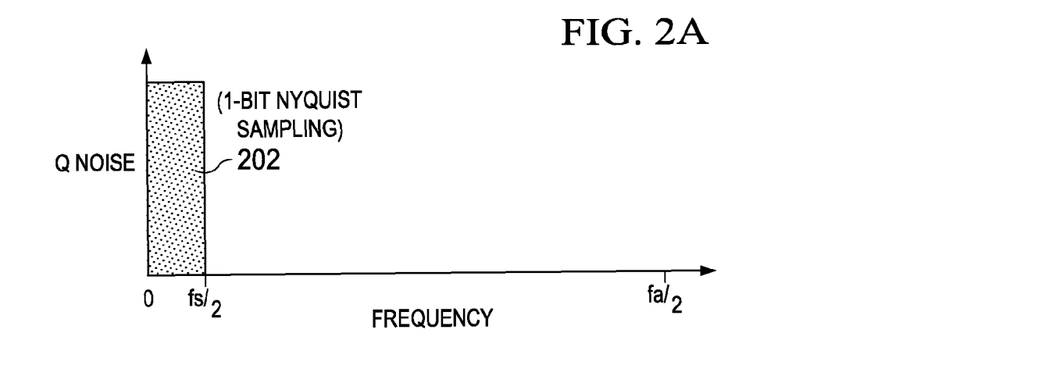
FIG. 2A is a plot of quantization noise as a function of frequency when using 1-bit Nyquist sampling.
Figure 2B:
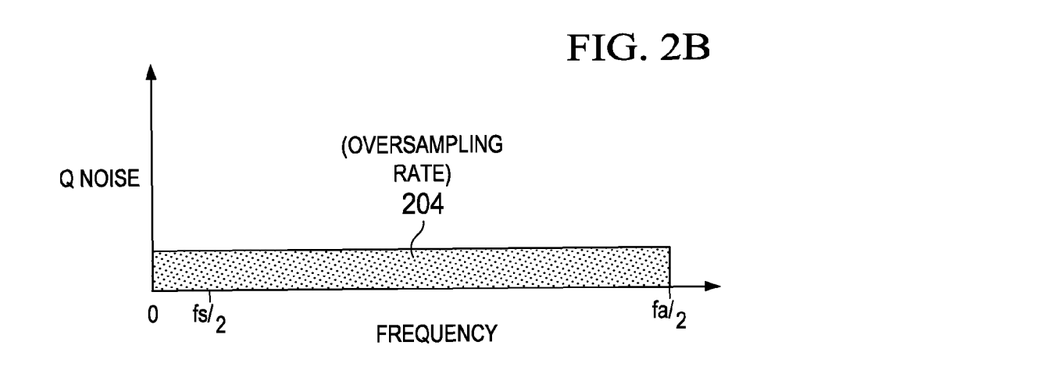
FIG. 2B is a plot of quantization noise as a function of frequency when using an oversampling rate of $f_a$.

FIG. 1 is a plot of an ideal analog output versus the magnitude of eight 3-bit binary words. In this example, the eight 3-bit binary words, 104, 106, 108, 110, 112, 114, 116 and 118 do not end at line 102, the ideal analog output. INL (Integrated Non-Linear) and DNL (Differential Non-Linear) distortion is created because these eight 3-bit binary words, 104, 106, 108, 110, 112, 114, 116 and 118 do not end at line 102. INL and DNL distortion may be caused by static element mismatch. For example, if current sources used in the DACs are not matched, INL and DNL distortion may occur. Pulse width modulation coupled with an N-tap AFIR filter in each cascade circuit reduces sensitivity to analog glitch energies and mismatch errors One source of noise is quantization noise. FIG. 2A is a plot of quantization noise as a function of frequency when using N-bit Nyquist sampling. The quantization noise in FIG. 2A is contained in the audio band. As a result, the quantization noise is added to the audio signal. FIG. 2B is a plot of quantization noise as a function of frequency when using an oversampling rate of Fa. The quantization noise in FIG. 2B is spread from DC (0 Hz) to Fa/2. In this case, quantization noise is reduced in the audio band, improving the signal-to-noise ratio. The same quantization noise is "spread thinner"

due to over-sampling. However, in this case more quantization noise is found in the out-of-band frequency range. The Nyquist case will have more quantization noise due to the images (repetitions of the spectrum) unless a sharp low-pass filter is applied.

Figure 2C:
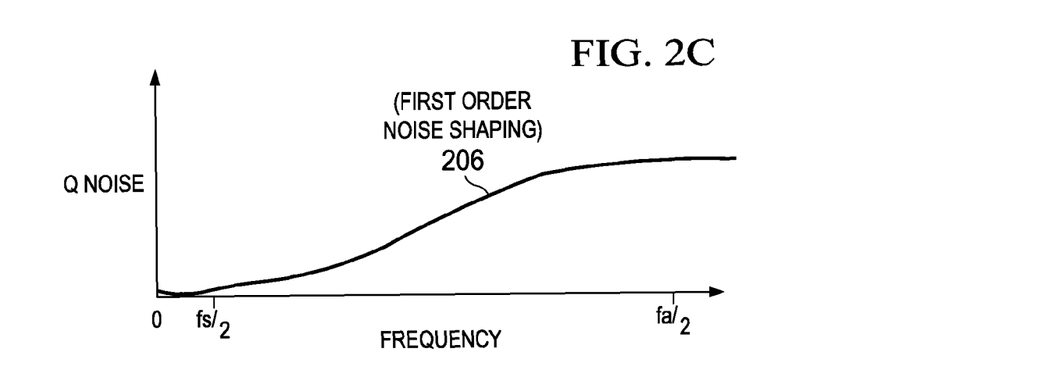
FIG. 2C is a plot of quantization noise as a function of frequency when first order noise-shaping is used.

FIG. 2C is a plot of quantization noise as a function of frequency when first order noise-shaping is used. In FIG. 2C, most of the quantization noise is removed from the audio band into the out-of-band frequency range. Because most of the quantization noise is removed from the audio band, the signal-to-noise ratio is improved. However, in this case more quantization noise is found out-of-band.

Figure 3:
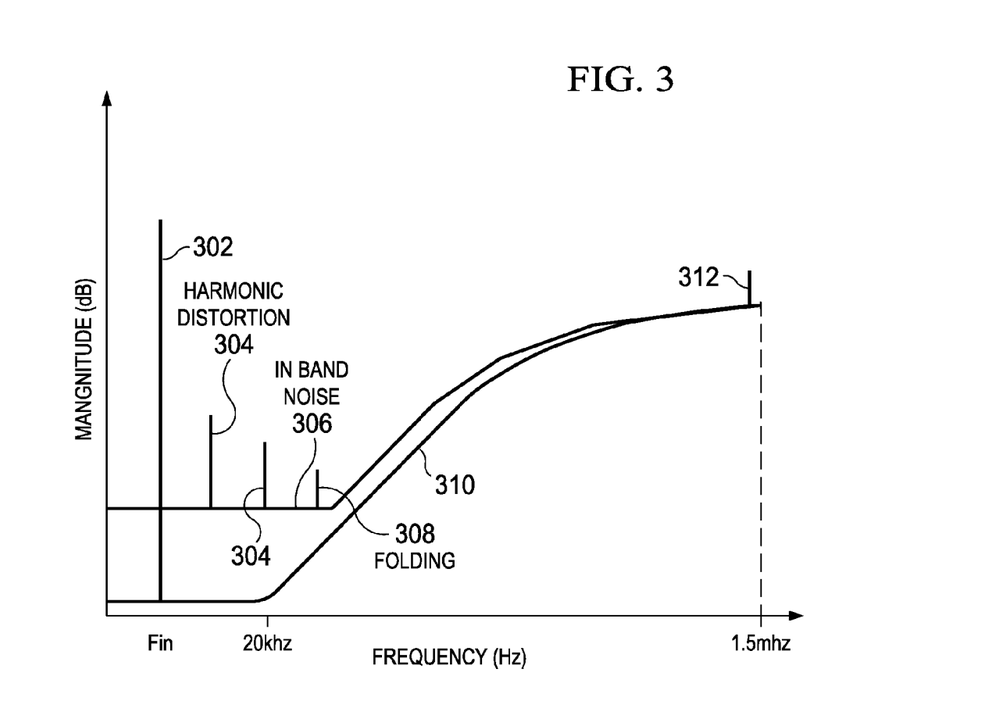
FIG. 3 is a plot of the magnitude of a sample frequency, harmonic distortion, in-band noise and folding noise as a function of frequency when a noise-shaping filter is used.

Due to analog nonlinearities such as mismatch errors and glitch energy, the out-of-band quantization noise 312 may be folded back into the audio band increasing the noise floor. FIG. 3 is a plot of the magnitude of a sample frequency 302, harmonic distortion 304, in-band noise quantization 306 and folding quantization noise 308 as a function of frequency when noise-shaping is used. In this example, out-of-band quantization noise 312 is folded back into the audible band as folding quantization noise 308. The noise-shaping filter shapes quantization noise as shown by curve 310.

Figure 4:
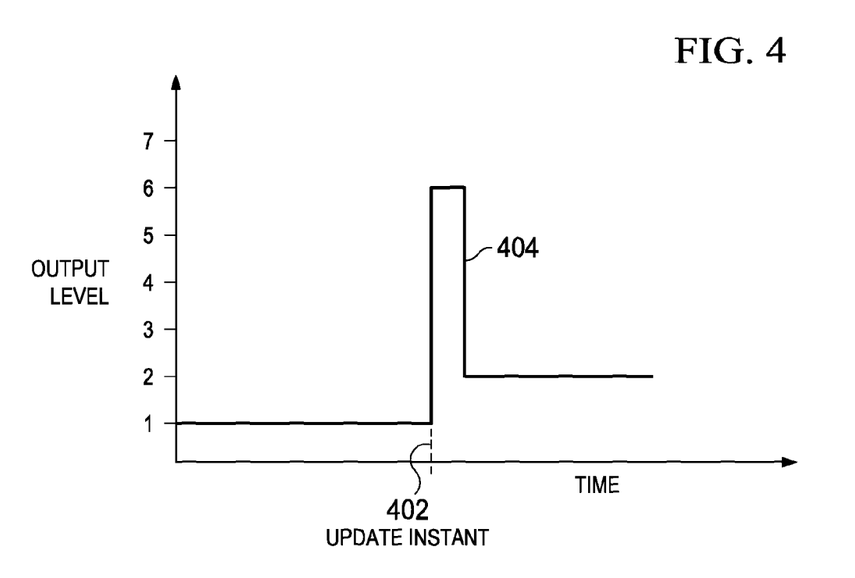
FIG. 4 is a plot of the output level of a DAC when switching from a first level to a second level when using a 2-bit binary word.

Dynamic error may be generated due to differences in rise and fall times, clock skew distribution, memory effects at the switching nodes, glitches and parasitic coupling between switching nodes between DAC elements. All of these dynamic errors can lead to distortion and noise. FIG. 4 is a plot of the output level of a DAC when switching from a first level to a second level when using a 2-bit binary word. In FIG. 4, the output level switches from level 1 to level 6 for a short time instead of the correct level 2 due to differences in rise and fall times. This "glitch" when switching from level 1 to level 2 causes dynamic distortion and noise.

The "glitch" shown in FIG. 4 may be reduced using thermometer encoding. Table 1 shows an example of thermometer encoding. In this example a 2-bit word is used. Thermometer encoding allows only one bit to switch at any time. Allowing only one bit to switch at any time for a single LSB step change in the input code reduces the number of glitches that may have occurred.

TABLE 1

| $b_1$ | $b_0$ | $t_3$ | $t_2$ | $t_1$ |
|---|---|---|---|---|
| 0 | 0 | 0 | 0 | 0 |
| 0 | 1 | 0 | 0 | 1 |
| 1 | 0 | 0 | 1 | 1 |
| 1 | 1 | 1 | 1 | 1 |

When $b_1=0$ and $b_0=1$ changes to $b_1=1$ and $b_0=0$, both $b_1$ and $b_0$ change. Because both $b_1$ and $b_0$ change, a dynamic error may occur as shown in FIG. 4. However, when thermometer encoding, $t_3, t_2, t_1$, is used as shown in Table 1, only one bit changes at a time. Because only one bit changes at a time, dynamic errors are reduced.

Figure 5:
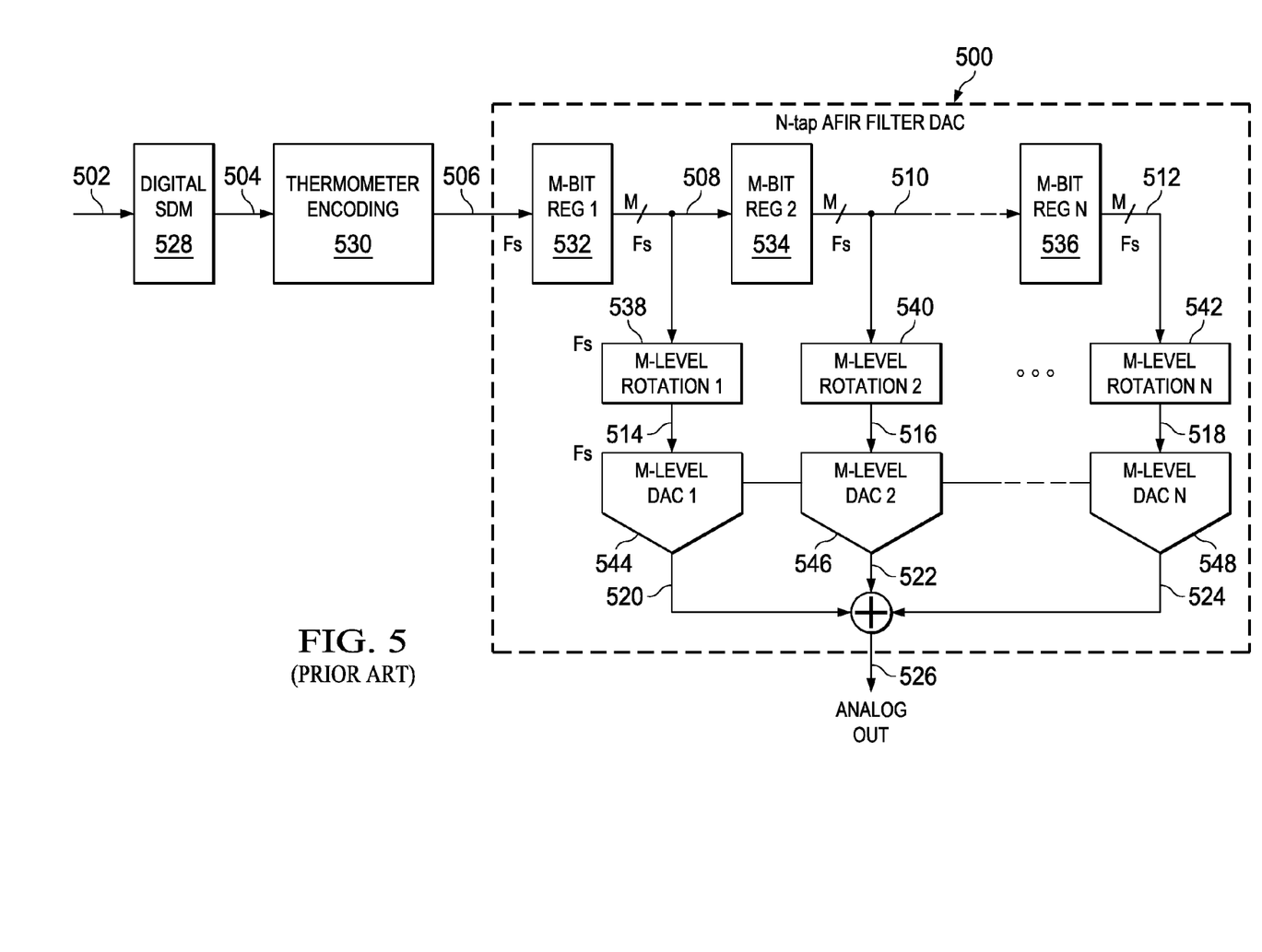
FIG. 5 is a schematic showing a digital SDM (Sigma Delta Modulation) filter, a thermometer encoder, and an N-tap AFIR (Analog Finite Impulse Response) Filter DAC (Prior Art).

The effects of analog glitch energies and mismatch errors may be reduced by including pulse width modulation with an N-tap AFIR filter in each cascade circuit. FIG. 5 shows a digital SDM (Sigma Delta Modulation) modulator 528, a thermometer encoder 530, and an N-tap AFIR (Analog Finite Impulse Response) filter DAC 500. As previously discussed the digital SDM 528 shifts quantization noise from the audible range to the out-of-band range and the thermometer encoding 530 reduces INL and DNL distortion.

The N-tap AFIR filter DAC 500 reduces out-of-band quantization noise and sensitivity to non-linearities and phase noise. The N-tap AFIR filter DAC 500 is implemented by dividing L-DAC segments into N-tap M-bit AFIR structures with equal coefficients where L=M*N. Matching between M-level DACs, 544, 546, 548 is typically not needed because it only affects the filter response. However, matching with an individual M-level DAC is usually necessary. In order to reduce the effects of mismatching, M-level rotation, 538, 540, 542 is used to create first order noise-shaping. The rotation insures that all M-1 segments inside one M-level DAC are used with the same average density/frequency. This causes the INL linear and shifts mismatch induced errors to be out of the audio band. This M-level rotation may be accomplished using barrel (circular) shifters.

Figure 6:
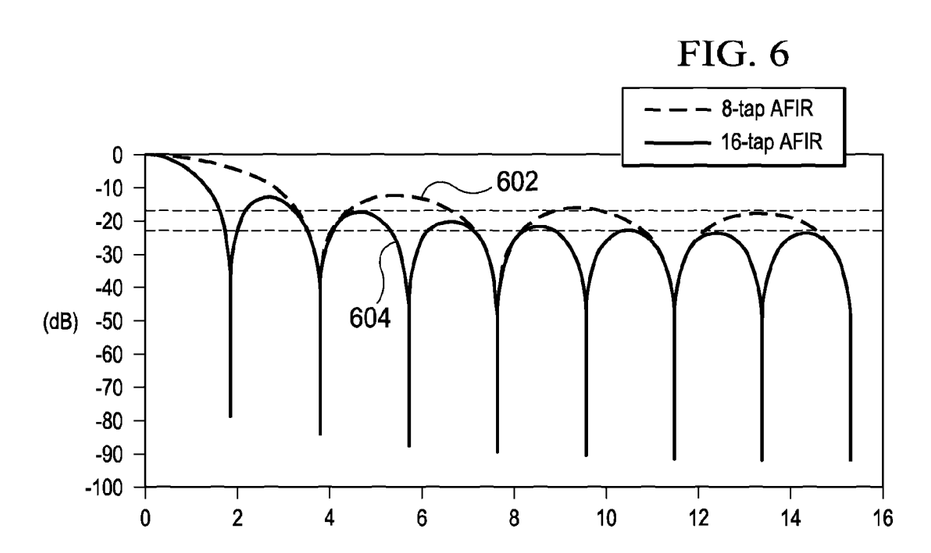
FIG. 6 is a plot of attenuation out-of-band noise when using 8-tap and a 16-tap AFIR (Analog Finite Impulse Response) Filter DACs.

FIG. 6 is a plot of attenuation of out-of-band quantization noise when using an 8-tap and a 16-tap AFIR filter DAC (unit coefficients giving a sinc response). An 8-tap AFIR filter DAC 602 attenuates out-of-band quantization noise on average for a white noise signal by 18 db. A 16-tap AFIR filter DAC 604 attenuates out-of-band quantization noise on average by 22 db. Neither of these N-tap AFIR filter DACs provides enough stop-band suppression. In addition, the M-level rotation, 538, 540, 542 may create tonal distortion at small signal levels. It is more efficient from an out-of-band noise perspective to use a single L-level DAC instead of the AFIR version shown in FIG. 5 (prior art) because RMS out-of-band noise scales down inversely proportionally with L for the single stage versus only −3 db/doubling for the AFIR case shown in FIG. 5 (prior art).

Figure 7:
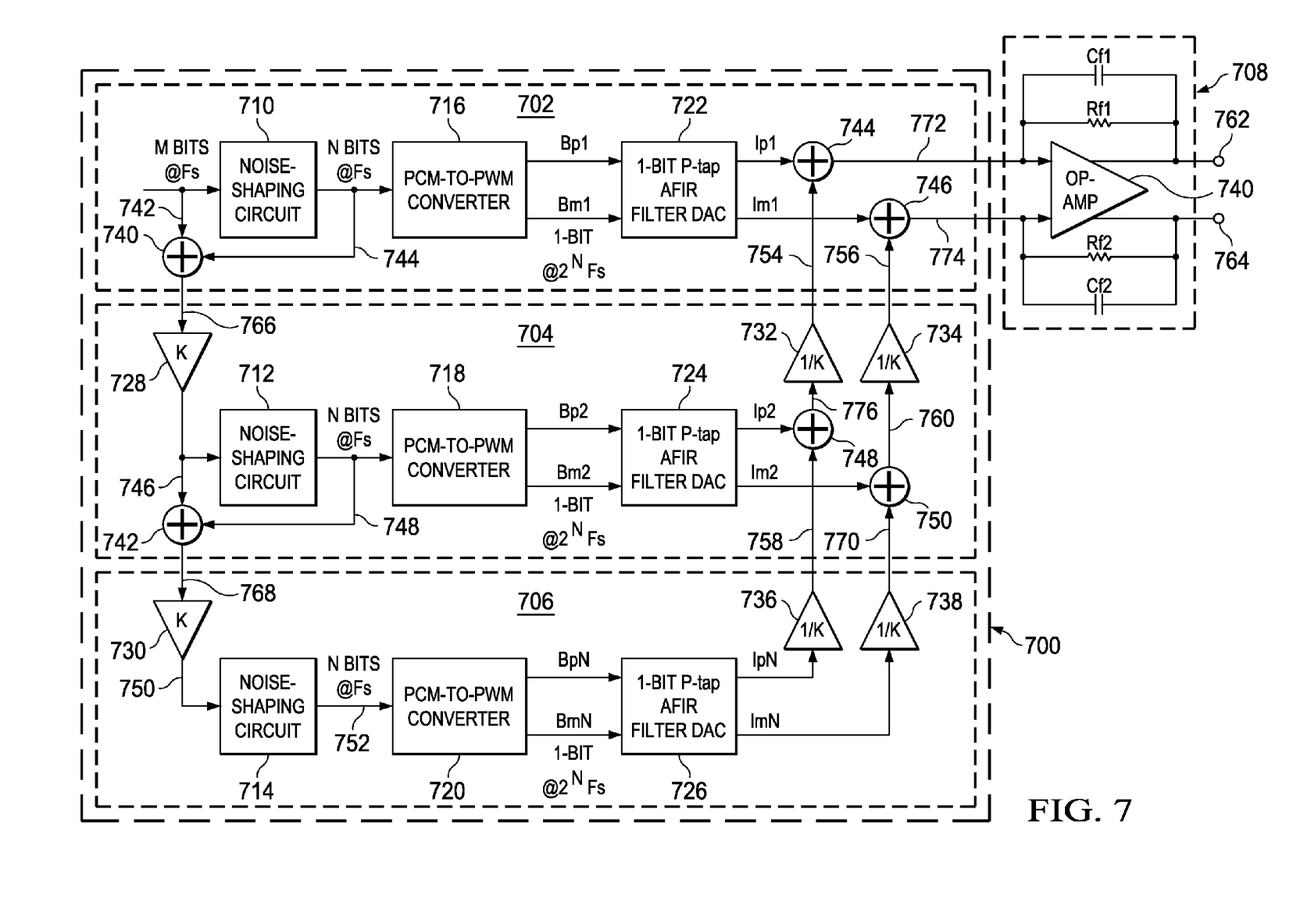
FIG. 7 is an exemplary embodiment of a cascaded circuit which includes a first cascade circuit, a second cascade circuit and a third cascade circuit.

FIG. 7 is an exemplary embodiment of a cascaded circuit 700 including a first cascade circuit 702, a second cascade circuit 704 and a third cascade circuit 706. In this exemplary embodiment a digital signal 742 is input to the cascaded circuit 700. The digital signal 742 is an M-bit PCM digital word received at a frequency of Fs. In this exemplary embodiment the analog differential output 772 and 774 of the cascaded circuit 700 are connected to the differential input of an amplifier 708.

The output 766 of the first cascade circuit 702 is connected to the input 766 of the second cascade circuit 704. Signal 766 is the quantization noise of the noise-shaping circuit 710. Signal 766 is fed into cascade circuit 704 in the digital domain and then subtracted in the analog domain in order or reduce the resulting quantization noise. The differential input 754 and 756 of the first cascade circuit 702 is connected to the differential output 754 and 756 of the second cascade circuit 704. The output 768 of the second cascade circuit 704 is connected to the input 768 of the third cascade circuit 706. The differential input 758 and 770 of the second cascade circuit 704 is connected to the differential output 758 and 770 of the third cascade circuit 704.

In this exemplary embodiment, the first cascade circuit 702 comprises a noise-shaping circuit 710, for example a SDM, a PCM- to PWM converter 716 and a 1-bit P-tap AFIR filter DAC 722. In this example, the input 742 of the noise-shaping circuit 710 is summed with the output 744 of the noise-shaping circuit 710. The sum of the input 742 and the output 744 of the noise-shaping circuit is the output 766 of the first cascade circuit 702. The output 744 of the noise-shaping circuit 710 is also connected to the input 744 of the PCM-to-PWM converter 716. The output 744 of the noise-shaping circuit 710 is, in this example, an N-bit PCM word with a sampling frequency of Fs where M is greater than N.

In this exemplary embodiment, the differential output Bp1 and Bm1 of the PCM-to-PWM converter 716 is connected to the differential input Bp1 and Bm1 of the 1-bit P-tap AFIR filter DAC 722. The differential output Bp1 and Bm1 of the PCM-to-PWM converter 716 is a 1-bit PWM word with a sampling frequency of $(2^N)*Fs$. The effects of analog glitch energies are reduced due to the use of pulse width modulation; the glitches for each segment are now repeated periodically due to PWM and this concentrates the error near harmonics of the PWM switching rate. Static mismatches inside the 1-bit P-tap AFIR DAC (722) only affect the AFIR filter response (linear error which does not produce distortion or noise).

The N-tap AFIR filter has notches at the harmonics of the PWM rate which aligns with the spectrum of the PWM signal thus reducing the out-of-band energy to a level similar to an N-level DAC. The reduction of the out-of-band energy is done with significantly reduced sensitivity to both static and dynamic mismatches. The analog output Ip1 and Im1 are summed with the differential input 754 and 756 of the first cascade circuit 702 respectively. The sum 772 and 774 of the analog output Ip1 and Im1 and the differential input 754 and 756 of the first cascade circuit 702 provides the analog differential output 772 and 774 of the cascaded circuit 700.

In this exemplary embodiment, the second cascade circuit 704 comprises a first gain circuit 728, a first gain attenuation circuit 732, a second gain attenuation circuit 734, a noise-shaping circuit 712, a PCM-to-PWM converter 718 and a 1-bit P-tap AFIR filter DAC 724. The first gain attenuation circuit 732 may be implemented, for example, by reducing the reference inputs to the 1-bit DACs inside the 1-bit P-tap AFIR filter DAC 724. In this example, the output 746 of the first gain circuit 728 is connected to the input 746 of the noise-shaping circuit 712. The input 746 of the noise-shaping circuit 712 is summed with the output 748 of the noise-shaping circuit 712. The sum of the input 742 and the output 744 of the noise-shaping circuit 712 is the output 768 of the second cascade circuit 704. The output 748 of the noise-shaping circuit 712 is also connected to the input 748 of the PCM-to-PWM converter 718. The output 748 of the noise-shaping circuit 710 is, in this example, an N-bit PCM word with a sampling frequency of Fs where M is greater than N.

In this exemplary embodiment, the differential output Bp2 and Bm2 of the PCM-to-PWM converter 718 is connected to the differential input Bp2 and Bm2 of the 1-bit P-tap AFIR filter DAC 724. The differential output Bp2 and Bm2 of the PCM-to-PWM converter 718 is a 1-bit PWM word with a sampling frequency of $(2^N)*Fs$. The effects of analog glitch energies and mismatch errors are reduced by including pulse width modulation with an N-tap AFIR filter in each cascade circuit. The analog output Ip2 and Im2 are summed with the differential input 758 and 770 of the second cascade circuit 704 respectively. The sum 776 and 760 of the analog output Ip2 and Im2 and the inputs 776 and 760 of the second cascade circuit 704 provides the analog inputs 776 and 760 of the first 732 and second 734 gain attenuation circuits. The outputs of the first 732 and second 734 gain attenuation circuits are connected to the differential output 754 and 756 of the second cascade circuit 704.

In this exemplary embodiment, the third cascade circuit 706 comprises a first gain circuit 730, a first gain attenuation circuit 736, a second gain attenuation circuit 738, a noise-shaping circuit 714, a PCM- to PWM converter 720 and a 1-bit P-tap AFIR filter DAC 726. In this example, the output 750 of the first gain circuit 730 is connected to the input 750 of the noise-shaping circuit 714. The output 752 of the noise-shaping circuit 714 is also connected to the input 752 of the PCM-to-PWM converter 720. The output 752 of the noise-shaping circuit 714 is, in this example, an N-bit PCM word with a sampling frequency of Fs where M is greater than N.

In this exemplary embodiment, the differential output BpN and BmN of the PCM-to-PWM converter 720 is connected to the differential input BpN and BmN of the 1-bit P-tap AFIR filter DAC 726. The differential output BpN and BmN of the PCM-to-PWM converter 720 is a 1-bit PWM word with a sampling frequency of $(2^N)*Fs$. The effects of analog glitch energies and mismatch errors are reduced by including pulse width modulation with an P-tap AFIR filter in each cascade circuit. The analog output IpN and ImN are the analog inputs IpN and ImN of the first 736 and second 738 gain attenuation circuits respectively. The outputs of the first 736 and second 738 gain attenuation circuits are connected to the differential output 758 and 770 of the third cascade circuit 706.

In this exemplary embodiment, the amplifier 708 comprises an op-amp 740, two capacitors Cf1 and Cf2, and two resistors Rf1 and Rf2. The resistor Rf1 and the capacitor Cf1 are connected between the first leg 772 of the differential input to the op-amp 740 and the first leg 762 of the differential output of the op-amp 740. The resistor Rf2 and the capacitor Cf2 are connected between the second leg 774 of the differential input to the op-amp 740 and the second leg 764 of the differential output of the op-amp 740.

In this exemplary embodiment, the noise-shaping circuits 710, 712 and 714 are SDM (Sigma Delta Modulated) circuits.

Figure 12:
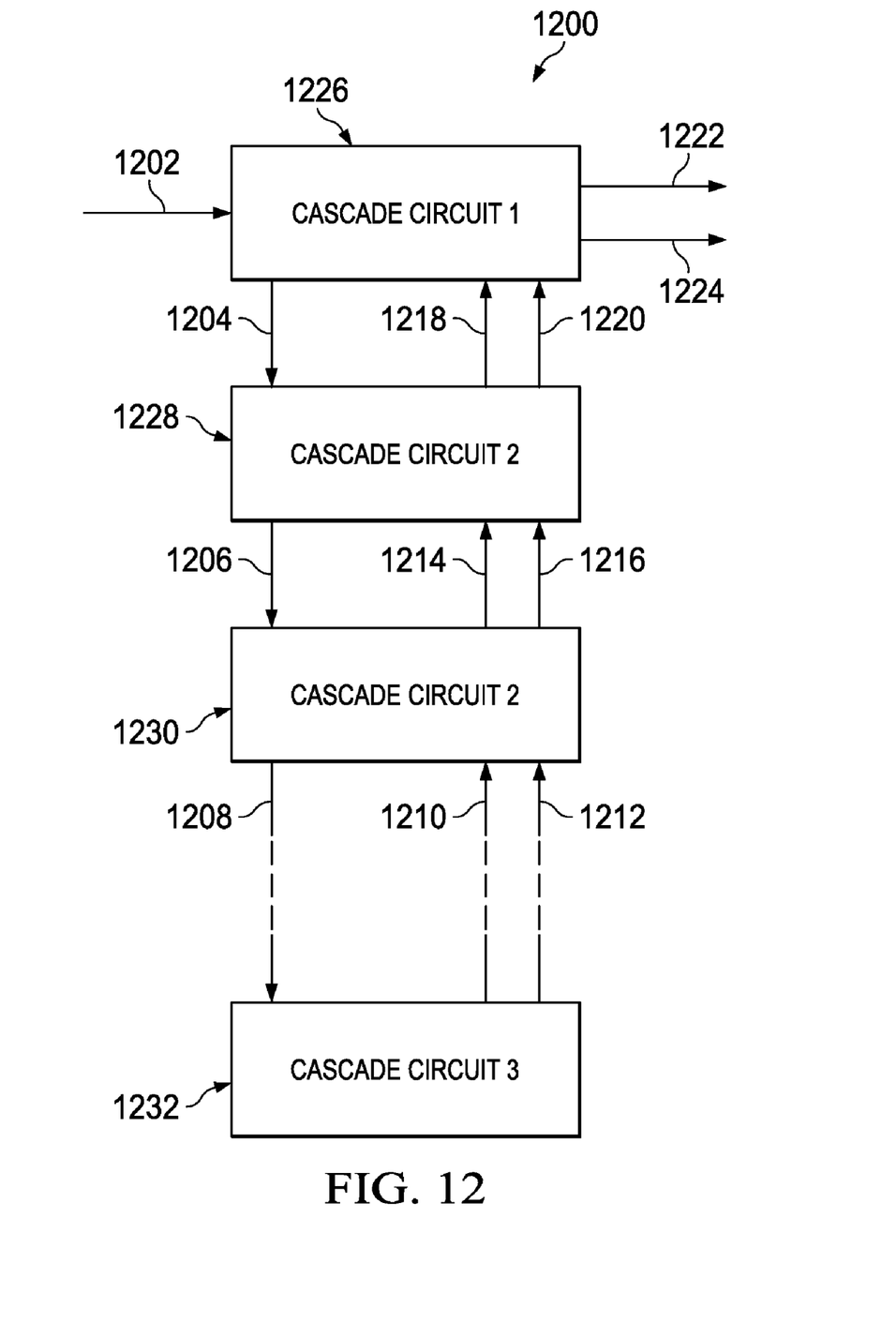
FIG. 12 is an exemplary embodiment of a cascaded circuit using at least four cascade circuits.

FIG. 12 is an exemplary embodiment of a cascaded circuit 1200 using at least four cascade circuits. The first cascade circuit 1226 is a copy of the cascade circuit 702 shown in FIG. 7. The second cascade circuit 1228 is a copy of the cascade circuit 704 shown in FIG. 7. The second cascade circuit 1230 is a copy of the cascade circuit 704 shown in FIG. 7. The third cascade circuit 1232 is a copy of the cascade circuit 706 shown in FIG. 7. In this exemplary embodiment, any number of second cascade circuits may be included as part of the cascaded circuit 1200. As more second cascade circuits are added, more noise is attenuated on the output 1222 and 1224 of the noise attenuation circuit 1200. As more second cascade circuits are added to the cascaded circuit, filtering capacitors Cf1 and Cf2 may no longer be needed in the amplifier 708. Capacitors Cf1 and Cf2 are typically large and expensive.

Figure 11:
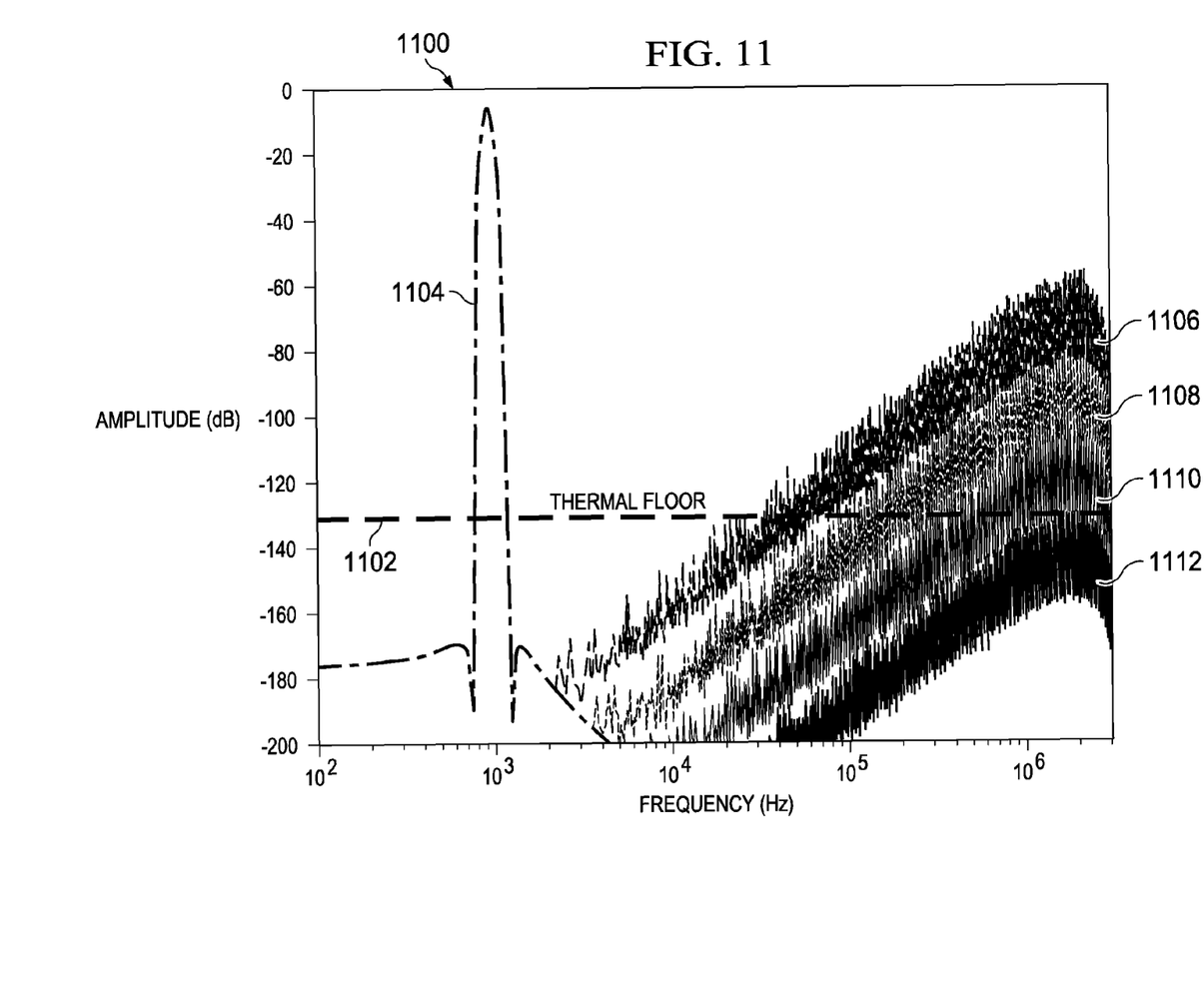
FIG. 11 is a plot of noise versus frequency when using a 1-bit P-tap AFIR Filter DAC.

FIG. 11 is a plot 1100 of out-of-band quantization noise versus frequency when using a cascaded circuit 1200. A signal 1104 centered around 1 kHz is input to the cascaded circuit 1200. A thermal noise floor 1102 is shown at around −120 db. As additional cascade circuits are cascaded into the cascaded circuit 1200, the out-of-band quantization noise level on the output, 1222 and 1224, of the cascaded circuit 1200 drops as shown by out-of-band quantization noise measurements 1106, 1108, 1110 and 1112. The out-of-band quantization noise measurement 1112 is below the thermal noise floor 1102. Out-of-band quantization noise may be reduced to a level that is at or below the thermal noise level with minimum silicon area.

Figure 8:
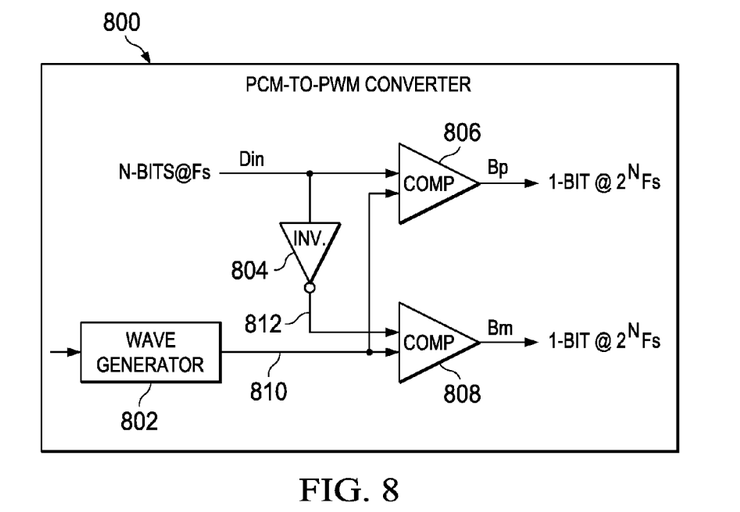
FIG. 8 is an exemplary embodiment of a PCM (Pulse Code Modulation)-to-PWM (Pulse Width Modulation) converter.

FIG. 8 is an exemplary embodiment of a PCM-to-PWM converter 800. In this exemplary embodiment an N-bit word at a sampling frequency of Fs is input to the input Din of the comparator 806 and the input Din of the inverter 804. A waveform generator 802 provides a signal 810 to the second input of the first comparator 806 and the second input of the second comparator 808. The output 812 of the inverter 804 is connected to the first input of the second comparator 808.

In this exemplary embodiment, the signal 810 provided by the waveform generator 802 is a triangle waveform having a frequency of Fc. The carrier frequency Fc may be, for example, 385 kHz or 768 kHz. However, other frequencies are anticipated. The outputs, Bp and Bm of the PCM-to-PWM converter 800 are 1-bit words at sampling frequency of $(2^N)*Fs$. The effects of analog glitch energies and mismatch errors are reduced by including pulse width modulation with an P-tap AFIR filter in each cascade circuit.

Figure 9:
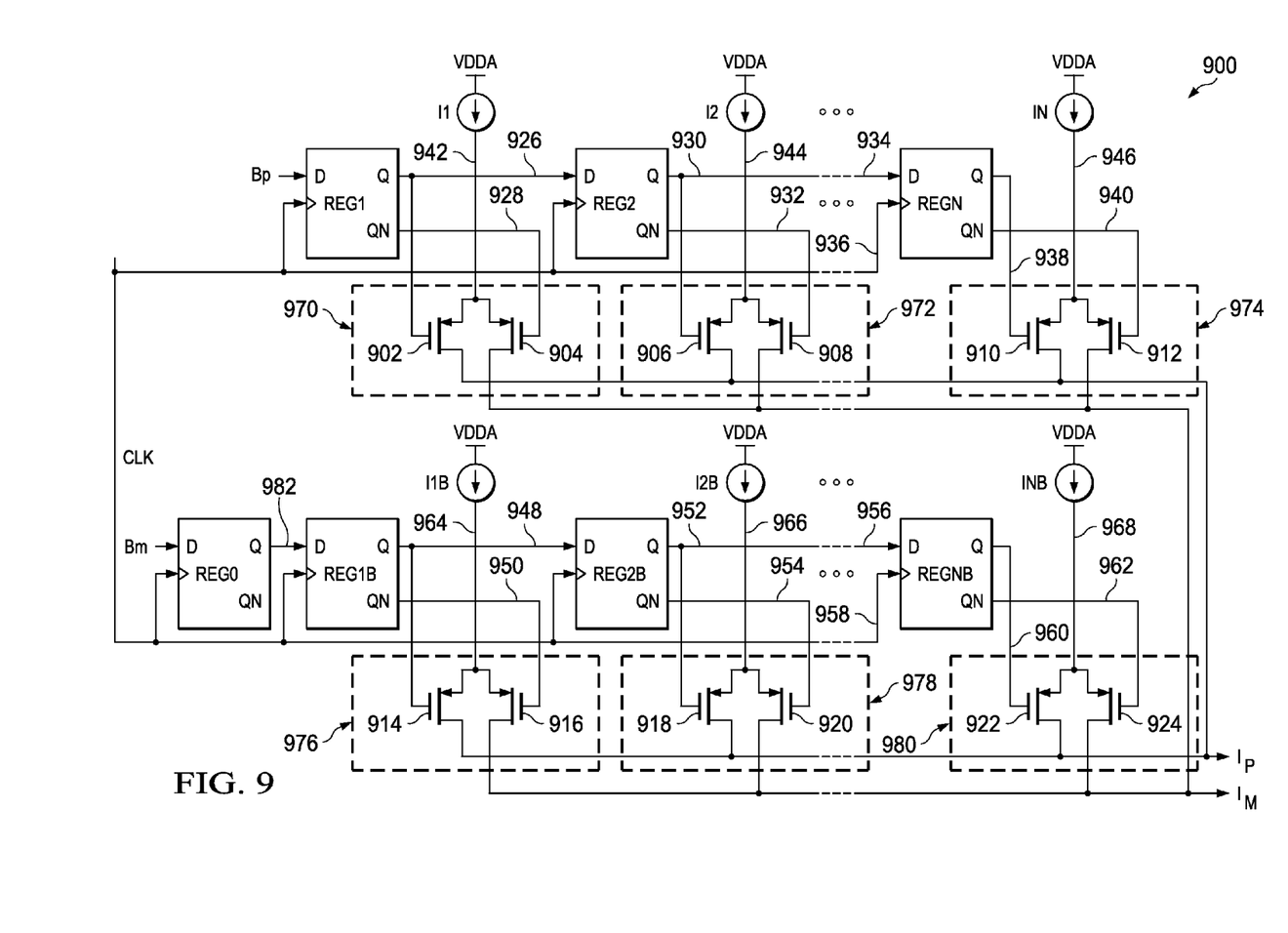
FIG. 9 is an exemplary embodiment of a 1-bit P-tap AFIR (Analog Finite Impulse Response) Filter DAC.

FIG. 9 is an exemplary embodiment of a 1-bit P-tap AFIR filter DAC 900. All of the registers in this exemplary embodiment are D-type flip-flops. Other types of registers are may be used. A clock signal CLK is connected to an input of each of the registers, REG0, REG1, REG2, REGN and REG1B, REG2B, REGNB. Current sources, I1, I2, IN, I1B, I2B, INB are connected to the inputs 942, 944, 946, 964, 966, 968 of each of the differential amplifiers 970, 972, 974, 976, 978, and 980 respectively. The differential outputs from each differential amplifier are connected to the outputs Ip and Im of the 1-bit P-tap AFIR filter DAC 900. A barrel shifter is not needed in this embodiment of the 1-bit P-tap AFIR filter DAC 900.

Input Bp of the 1-bit P-tap AFIR filter DAC 900 is connected to input D of the REG1. Outputs Q and QN of REG1 are connected to inputs 926 and 928 of differential amplifier 970 respectively. Output Q of REG1 is also connected to input D of REG2. Outputs Q and QN of REG2 are connected to inputs 930 and 932 of differential amplifier 972 respectively. Output Q of REG2 is also connected to input D of REGN. The dotted lines and dashed lines in FIG. 9 indicate that any number of taps may be used. Outputs Q and QN of REGN are connected to inputs 938 and 940 of differential amplifier 974 respectively. PFETs (P-type Field Effect Transistors) are used in this exemplary embodiment; however other types of transistors may be used.

Input Bn of the 1-bit P-tap AFIR filter DAC 900 is connected to input D of the REG0. Output Q of REG0 is connected to the D input of REG1B. Outputs Q and QN of REG1B are connected to inputs 948 and 950 of differential amplifier 976 respectively. Output Q of REG1B is also connected to input D of REG2B. Outputs Q and QN of REG2B are connected to inputs 952 and 954 of differential amplifier 978 respectively. Output Q of REG2B is also connected to input D of REGNB. The dotted lines and dashed lines in FIG. 9 indicate that any number of taps may be used. Outputs Q and QN of REGNB are connected to inputs 960 and 962 of differential amplifier 980. PFETs (P-type Field Effect Transistors) are used in this exemplary embodiment; however other types of transistors may be used.

Figure 10:
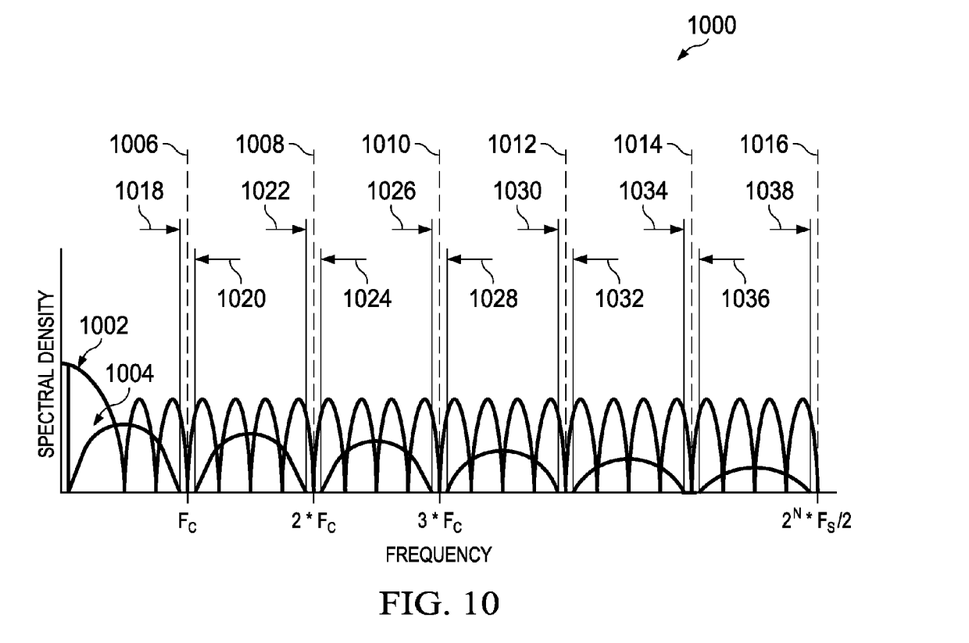
FIG. 10 is a plot of spectral density versus frequency when using a 1-bit P-tap AFIR Filter DAC.

FIG. 10 is a plot of spectral density versus frequency when using a 1-bit P-tap AFIR filter DAC. Waveform 1002 shows the out-of-band quantization noise for an 8-tap AFIR. Waveform 1004 shows the out-of-band quantization noise for an 8-tap AFIR. Because the switching rate of the DAC segments is a function of the PWM carrier frequency Fc, the notches of the AFIR filter are located a integer values of the carrier frequency Fc. A first notch is shown in FIG. 10 between 1018 and 1020 with the audio information 1006 located in the middle of the first notch. A second notch is shown in FIG. 10 between 1022 and 1024 with the audio information 1008 located in the middle of the second notch.

Instead of relying on the absolute stop-band ripple size of a standard AFIR filter, the cascaded circuit 700 relies on the notches of the AFIR filter. As a result, the out-of-band quantization noise is greatly attenuated as shown in FIG. 11. The cascaded circuit also reduces the impact of static mismatch error because the 1-bit DACs used are substantially linear. Dynamic errors are also reduced because the distortion of the carrier frequency Fc is outside the audible range.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A cascaded circuit for reducing noise, the cascaded circuit comprising:
    a first cascade circuit comprising:
        a first noise-shaping circuit;
        a first PCM-to-PWM converter;
        an first 1-bit P-tap AFIR filter DAC, where P is an integer value;
        wherein the first noise-shaping circuit shifts a portion of quantization noise in a PCM M-bit digital word from an in-band frequency range to an out-of-band frequency range;
        wherein a sampling frequency of the PCM M-bit digital word is Fs;
        wherein the first noise-shaping circuit converts the PCM M-bit digital word to a first PCM N-bit word, where M and N are integer values and M is greater than N;
        wherein a sampling frequency of the first PCM N-bit word is Fs;
        wherein the first PCM N-bit word is converted to a first PWM 1-bit word sampled at a frequency of $(2^N)*Fs$;
        wherein the first 1-bit P-tap AFIR filter DAC converts the first PWM 1-bit word to a first analog signal.

2. The cascaded circuit of claim 1 further comprising a second cascade circuit, the second cascade circuit comprising:
    a first gain circuit, the first gain circuit having a gain of K;
    a second noise-shaping circuit;
    a second PCM-to-PWM converter;
    an second 1-bit P-tap AFIR filter DAC;
    a first gain attenuation circuit, the first gain attenuation circuit having a gain of 1/K;
    wherein the PCM M-bit digital word and the first PCM N-bit word are summed, the sum of the PCM M-bit digital word and the first PCM N-bit word represented by SUM1;
    wherein the first gain stage increases the gain of the SUM1 by K; where the SUM1 increased by K is represented by K*SUM1;
    wherein the second noise-shaping circuit shifts a portion of quantization noise in the K*SUM1 from an in-band frequency range to an out-of-band frequency range;
    wherein the second noise-shaping circuit converts the K*SUM1 to a second PCM N-bit word;
    wherein a sampling frequency of the second PCM N-bit word is Fs;
    wherein the second PCM N-bit word is converted to a second PWM 1-bit word sampled at a frequency of $(2^N)*Fs$;
    wherein the second 1-bit P-tap AFIR filter DAC converts the second PWM 1-bit word to a second analog signal.
    wherein the second analog signal is reduced in gain by 1/K by the first gain attenuation circuit;
    wherein the second analog signal reduced in gain by 1/K is summed with the first analog signal.

3. The cascaded circuit of claim 2 wherein the first and second noise-shaping circuits are Sigma Delta Modulated (SDM) circuits.

4. The cascaded circuit of claim 2 wherein the first and second PCM-to-PWM converters further comprise:
    a first comparator, the first comparator having a first input, a second input and an output;

a second comparator, the second comparator having a first input, a second input and an output;
an inverter, the inverter having an input and an output;
wherein a carrier signal is applied to the second input of the first comparator and to the second input of the second carrier;
wherein the input of the PCM-to-PWM converter is connected to the first input of the first comparator and to the input of the inverter;
wherein the output of the inverter is connected to the first input of the second comparator;
wherein the outputs of the first and second comparators are connected to the differential output of the PCM-to-PWM converter.

5. The cascaded circuit of claim 4 wherein the carrier signal is a triangular waveform signal.

6. The cascaded circuit of 5 wherein a frequency of the triangular waveform signal is selected from a group consisting of 384 KHz and 768 KHz.

7. The cascaded circuit of claim 2 wherein the first and second 1-bit P-tap AFIR filter DACs further comprise a 1-bit 4-tap AFIR filter DAC, the 1-bit 4-tap AFIR filter DAC further comprising:
eight current sources, each of the eight current sources having an input and an output wherein the input of each of the eight current sources is connected to a power supply;
a group of eight differential amplifiers, each of the eight differential amplifiers having an input, a differential input and a differential output wherein the differential output of each of the eight differential amplifiers is connected to the differential output of the 1-bit 4-tap AFIF filter DAC;
wherein the output from each of the eight current sources is connected to the input of each differential amplifier respectively;
a group of nine registers, each of the nine registers having a first input, a second input, a first output and a second output, wherein the second input of each of the nine registers is connected to a clock signal;
wherein the differential input of the 1-bit 4-tap AFIR filter DAC is connected to the first input of the first register and to the first input of the fifth register;
wherein the first output of the first register is connected to the first input of the second register and the first input of the first differential amplifier;
wherein the second output of the first register is connected to the second input of the first differential amplifier;
wherein the first output of the second register is connected to the first input of the third register and the first input of the second differential amplifier;
wherein the second output of the second register is connected to the second input of the second differential amplifier;
wherein the first output of the third register is connected to the first input of the fourth register and the first input of the third differential amplifier;
wherein the second output of the third register is connected to the second input of the third differential amplifier;
wherein the first output of the fourth register is connected to the first input of the fourth differential amplifier;
wherein the second output of the fourth register is connected to the second input of the fourth differential amplifier;
wherein the first output of the fifth register is connected to the first input of the sixth register;
wherein the first output of the sixth register is connected to the first input of the seventh register and the first input of the fifth differential amplifier;
wherein the second output of the sixth register is connected to the second input of the fifth differential amplifier;
wherein the first output of the seventh register is connected to the first input of the eight register and the first input of the sixth differential amplifier;
wherein the second output of the seventh register is connected to the second input of the sixth differential amplifier;
wherein the first output of the eighth register is connected to the first input of the ninth register and the first input of the seventh differential amplifier;
wherein the second output of the eighth register is connected to the second input of the seventh differential amplifier;
wherein the first output of the ninth register is connected to the first input of the eight differential amplifier;
wherein the second output of the ninth register is connected to the second input of the eighth differential amplifier.

8. The cascaded circuit of claim 7 wherein a differential amplifier from the group of eight differential amplifiers further comprises:
a first P-FET, the first P-FET having a drain, gate and source
a second P-FET, the second P-FET having a drain, gate and source;
wherein the drains of the first and second P-FETs are connected to the differential output of the differential amplifier;
wherein the sources of the first and second P-FETs are connected to the input of the differential amplifier;
wherein the gates of the first and second P-FETs are connected to the differential input of the differential amplifier.

9. The cascaded circuit of claim 7 wherein a register from the group of nine registers further comprises a D-type flip-flop.

10. A cascaded circuit for reducing noise, the cascaded circuit comprising:
a first cascade circuit comprising:
a first noise-shaping circuit;
a first PCM-to-PWM converter;
a first 1-bit P-tap AFIR filter DAC, where P is an integer value;
wherein the first noise-shaping circuit shifts a portion of quantization noise in a PCM M-bit digital word from an in-band frequency range to an out-of-band frequency range;
wherein a sampling frequency of the PCM M-bit digital word is Fs;
wherein the first noise-shaping circuit converts the PCM M-bit digital word to a first PCM N-bit word, where M and N are integer values and M is greater than N;
wherein a sampling frequency of the first PCM N-bit word is Fs;
wherein the first PCM N-bit word is converted to a first PWM 1-bit word sampled at a frequency of $(2^N)*Fs$;
wherein the first 1-bit P-tap AFIR filter DAC converts the first PWM 1-bit word to a first analog signal.

11. The cascaded circuit of claim 10 further comprising:
at least a second cascade circuit, the at least second cascade circuit comprising:
a first gain circuit, the first gain circuit having a gain of K;
a second noise-shaping circuit;

a second PCM-to-PWM converter;
a second 1-bit P-tap AFIR filter DAC;
a first gain attenuation circuit, the first gain attenuation circuit having a gain of 1/K;
wherein the PCM M-bit digital word and the first PCM N-bit word are summed, the sum of the PCM M-bit digital word and the first PCM N-bit word represented by SUM1;
wherein the first gain stage increases the gain of the SUM1 by K; where the SUM1 increased by K is represented by K*SUM1;
wherein the second noise-shaping circuit shifts a portion of quantization noise in the K*SUM1 from an in-band frequency range to an out-of-band frequency range;
wherein the second noise-shaping circuit converts the K*SUM1 to a second PCM N-bit word;
wherein a sampling frequency of the second PCM N-bit word is Fs;
wherein the second PCM N-bit word is converted to a second PWM 1-bit word sampled at a frequency of $(2^N)*Fs$;
wherein the second 1-bit P-tap AFIR filter DAC converts the second PWM 1-bit word to a second analog signal;
wherein the second analog signal is reduced in gain by 1/K by the first gain attenuation circuit;
wherein the second analog signal reduced in gain by 1/K is summed with the first analog signal.

12. The cascaded circuit of claim 11 further comprising:
a third cascade circuit, the third cascade circuit comprising:
a second gain circuit, the second gain circuit having a gain of K;
a third noise-shaping circuit;
a third PCM-to-PWM converter;
a third 1-bit P-tap AFIR filter DAC;
a second gain attenuation circuit, the second gain attenuation circuit having a gain of 1/K;
wherein the K-SUM1 and the second PCM N-bit word are summed, the sum of the K-SUM1 and the second PCM N-bit word represented by SUM2;
wherein the second gain stage increases the gain of the SUM2 by K;
where the SUM2 increased by a gain of K is represented by K*SUM2;
wherein the third noise-shaping circuit shifts a portion of quantization noise in the K*SUM2 from an in-band frequency range to an out-of-band frequency range;
wherein the third noise-shaping circuit converts the K*SUM2 to a third PCM N-bit word;
wherein a sampling frequency of the third PCM N-bit word is Fs;
wherein the third PCM N-bit word is converted to a third PWM 1-bit word sampled at a frequency of $(2^N)*Fs$;
wherein the third 1-bit P-tap AFIR filter DAC converts the third PWM 1-bit word to a third analog signal;
wherein the third analog signal is reduced in gain by 1/K by the second gain attenuation circuit;
wherein the third analog signal reduced in gain by 1/K is summed with the second analog signal.

13. The cascaded circuit of claim 12 wherein the first, the second and third noise-shaping circuits are Sigma Delta Modulated (SDM) circuits.

14. The cascaded circuit of claim 12 wherein the first, second and third PCM-to-PWM converters further comprise:
a first comparator, the first comparator having a first input, a second input and an output;
a second comparator, the second comparator having a first input, a second input and an output;
an inverter, the inverter having an input and an output;
wherein a carrier signal is applied to the second input of the first comparator and to the second input of the second carrier;
wherein the input of the PCM-to-PWM converter is connected to the first input of the first comparator and to the input of the inverter;
wherein the output of the inverter is connected to the first input of the second comparator;
wherein the outputs of the first and second comparators are connected to the differential output of the PCM-to-PWM converter.

15. The cascaded circuit of claim 14 wherein the carrier signal is a triangular waveform signal.

16. The cascaded circuit of 15 wherein a frequency of the triangular waveform signal is selected from a group consisting of 384 KHz and 768 KHz.

17. A method for reducing noise in an analog signal when converting a M-bit PCM digital signal to the analog signal, the method comprising:
shifting quantization noise in the M-bit PCM digital signal from an in-band frequency range to an out-of-band frequency range;
converting the M-bit PCM digital signal to a first N-bit PCM digital signal where M and N are integer values and where M is greater than N;
summing the M-bit PCM digital signal with the first N-bit PCM digital signal wherein the sum of the M-bit PCM digital signal with the first N-bit PCM digital signal is represented by SUM1;
converting the first N-bit PCM digital signal to a first 1-bit PWM digital signal;
applying the first 1-bit PWM digital signal to a first 1-bit P-tap AFIR filter DAC, wherein the value P is an integer value;
wherein an output of the first 1-bit P-tap AFIR filter DAC comprises the analog signal.

18. The method of claim 17 further comprising:
amplifying the SUM1 by a factor K wherein the amplified SUM1 is represented by K*SUM1;
shifting quantization noise in the K*SUM1 from an in-band frequency range to an out-of-band frequency range;
converting the K*SUM1 to a second N-bit PCM digital signal where M and N are integer values and where M is greater than N;
summing the K*SUM1 with the second N-bit PCM digital signal wherein the sum of the K*SUM1 with the second N-bit PCM digital signal is represented by SUM2;
converting the second N-bit PCM digital signal to a second 1-bit PWM digital signal;
applying the second 1-bit PWM digital signal to a second 1-bit P-tap AFIR filter DAC, wherein the value P is an integer value;
wherein an output of the second 1-bit P-tap AFIR filter DAC is amplified by factor of 1/K, wherein the amplified output of the second 1-bit P-tap AFIR DAC is represented by SUM3/K
wherein the SUM3/K further comprises the analog signal.

19. The method of claim 18 further comprising:
amplifying the SUM2 by a factor K wherein the amplified SUM2 is represented by K*SUM2;
shifting quantization noise in the K*SUM2 from an in-band frequency range to an out-of-band frequency range;

converting the K*SUM2 to a third N-bit PCM digital signal where M and N are integer values and where M is greater than N;

converting the third N-bit PCM digital signal to a third 1-bit PWM digital signal;

applying the third 1-bit PWM digital signal to a third 1-bit P-tap AFIR filter DAC, wherein the value P is an integer value;

wherein an output of the third 1-bit P-tap AFIR filter DAC is amplified by factor of $1/K^2$, wherein the amplified output of the third 1-bit P-tap AFIR DAC filter is represented by $SUM4/K^2$ wherein the $SUM4/K^2$ further comprises the analog signal.

20. The method of claim 17 wherein the quantization noise is shifted using sigma delta modulation.

* * * * *